United States Patent
Portaluri et al.

[11] Patent Number: 6,127,873
[45] Date of Patent: Oct. 3, 2000

[54] FEEDFORWARD CIRCUIT STRUCTURE WITH PROGRAMMABLE ZEROS FOR PROVIDING PROGRAMMABLE GROUP DELAY OF A WIDE SIGNAL BAND

[75] Inventors: Salvatore Portaluri, Pavia; Valerio Pisati, Bosnasco, both of Italy

[73] Assignee: STMicroelectronics S.r.l., Agrate Brianza, Italy

[21] Appl. No.: 09/221,199

[22] Filed: Dec. 23, 1998

[30] Foreign Application Priority Data

Dec. 23, 1997 [EP] European Pat. Off. .............. 97830696

[51] Int. Cl.[7] .................................................. H03H 11/26
[52] U.S. Cl. ........................................... 327/278; 327/287
[58] Field of Search ................................. 327/52, 53, 154, 327/261, 263, 264, 266, 278, 280, 281, 285, 287, 288, 405, 432, 437, 478, 490; 323/315, 316

[56] References Cited

U.S. PATENT DOCUMENTS

| | | | |
|---|---|---|---|
| 4,611,136 | 9/1986 | Fujie ........................................ | 327/287 |
| 4,886,982 | 12/1989 | Villa et al. .............................. | 327/432 |
| 5,235,540 | 8/1993 | DeVeirman ............................. | 364/825 |
| 5,644,267 | 7/1997 | Brianti et al. .......................... | 327/553 |
| 5,910,748 | 6/1999 | Reffay et al. ........................... | 327/432 |
| 5,982,214 | 11/1999 | Kim ........................................ | 327/280 |
| 5,994,939 | 11/1999 | Johnson et al. ......................... | 327/287 |

FOREIGN PATENT DOCUMENTS

| | | |
|---|---|---|
| 0 696 846 A1 | 2/1996 | European Pat. Off. . |
| 41 13 244 A1 | 10/1991 | Germany . |

OTHER PUBLICATIONS

Vainio, Olli, and Seppo J. Ovaska, "A Class of Active–RC Filters with Predictive Characteristics," IEEE, Apr. 1995, pp. 358–363.

*Primary Examiner*—My-Trang Nuton
*Attorney, Agent, or Firm*—Theodore E. Galanthay; David V. Carlson; Seed IP Law Group PLLC

[57] ABSTRACT

A feedforward circuit structure with programmable zeros for synthesizing continuous-time filters, delay lines, and the like is described. The circuit comprises a first cell and a second cell which are cascade-connected. Each one of the first and second cells comprises first and second pairs of bipolar transistors. The emitter terminals of the first pair of transistors are connected to a first current source, and the emitter terminals of the second pair of transistors are connected to a second current source. A first high-impedance element is connected between the first and second pairs of transistors, and a second high-impedance element is connected at an output of the second pair of transistors. A fifth transistor is connected between the collector terminal of a first transistor of the first pair of transistors and the collector terminal of a second transistor of the second pair of transistors. The base terminal of the fifth transistor receives a signal which is taken from the collector terminal of the first transistor of the first pair of transistors, with the signal being taken with a positive sign in the first cell and with a negative sign in the second cell, in order to determine a transfer function with a pair of singularities at the numerator. The second transistors of the first and second pairs of transistors are controlled respectively by third and fourth current sources which have mutually different values.

22 Claims, 1 Drawing Sheet

FEEDFORWARD CIRCUIT STRUCTURE WITH PROGRAMMABLE ZEROS FOR PROVIDING PROGRAMMABLE GROUP DELAY OF A WIDE SIGNAL BAND

TECHNICAL FIELD

The present invention relates generally to circuitry having programmable zeros for use in continuous-time filters, delay lines, and the like. More particularly, the invention relates to circuitry having a feedforward structure with programmable zeros for providing programmable delay cells.

BACKGROUND OF THE INVENTION

It is known that the frequency response of an amplified signal entails a correlation between the frequency response of the amplitude (modulus) of the signal and the frequency response of the phase of said signal. In particular, as the band increases, the phase changes and the group delay is reduced. Group delay is defined as the derivative of the phase with respect to the frequency.

Theoretically, the desirable result is a programmable delay with an infinite band.

In applications in which it is necessary to have a delay which can be programmed according to requirements while maintaining a wide signal band, conventional circuits do not adequately maintain signal bandwidth. Such conventional circuits resort to operational-amplifier structures which require the use of control loops, with high orders of filtering, high current consumption and large semiconductor areas for their implementation. In conventional structures of the feedback type, derivative signals are introduced in high-frequency points of the circuit, thereby introducing zeros in the transfer function and producing the above-described disadvantages.

SUMMARY OF THE INVENTION

In accordance with the present invention, a feedforward circuit structure with programmable zeros is provided. The circuit comprises a first cell and a second cell which are cascade-connected. Each one of said first and second cells comprises first and second pairs of bipolar transistors. The emitter terminals of said first pair of transistors are connected to a first current source, and the emitter terminals of said second pair of transistors are connected to a second current source. A first high-impedance element is connected between said first and second pairs of transistors, and a second high-impedance element is connected at an output of said second pair of transistors. A fifth transistor is connected between the collector terminal of a first transistor of said first pair of transistors and the collector terminal of a second transistor of said second pair of transistors. The base terminal of said fifth transistor receives a signal which is taken from the collector terminal of said first transistor of the first pair of transistors, with the signal being taken with a positive sign in said first cell and with a negative sign in said second cell, in order to determine a transfer function with a pair of singularities at the numerator. The second transistors of said first and second pairs of transistors are controlled respectively by third and fourth current sources which have mutually different values.

One advantage of the present invention is that the feedforward circuit structure with programmable zeros may be used for producing continuous-time filters, delay lines, and the like that provide a programmable delay while maintaining a wide signal band. Another advantage of the present invention is that the feedforward circuit structure with programmable zeros may be used for producing continuous-time filters, delay lines, and the like that provide frequency amplification of the modulus of a signal without altering its phase response. Another advantage of the present invention is that the feedforward circuit structure with programmable zeros may be used for producing continuous-time filters, delay lines, and the like in which the circuit structure is obtained in an open-loop mode. Another advantage of the present invention is that the feedforward circuit structure with programmable zeros may be used for producing continuous-time filters, delay lines, and the like having low current consumption and reduced semiconductor area occupation. Another advantage of the present invention is that the feedforward circuit structure with programmable zeros may be used for producing continuous-time filters, delay lines, and the like which are highly reliable and relatively easy to manufacture at low costs.

BRIEF DESCRIPTION OF THE DRAWINGS

Further characteristics and advantages of the invention will become apparent from the description of preferred but not exclusive embodiments of the feedforward structure according to the invention, illustrated only by way of non-limitative example in the accompanying drawings, wherein.

DETAILED DESCRIPTION OF THE INVENTION

Figure 1:
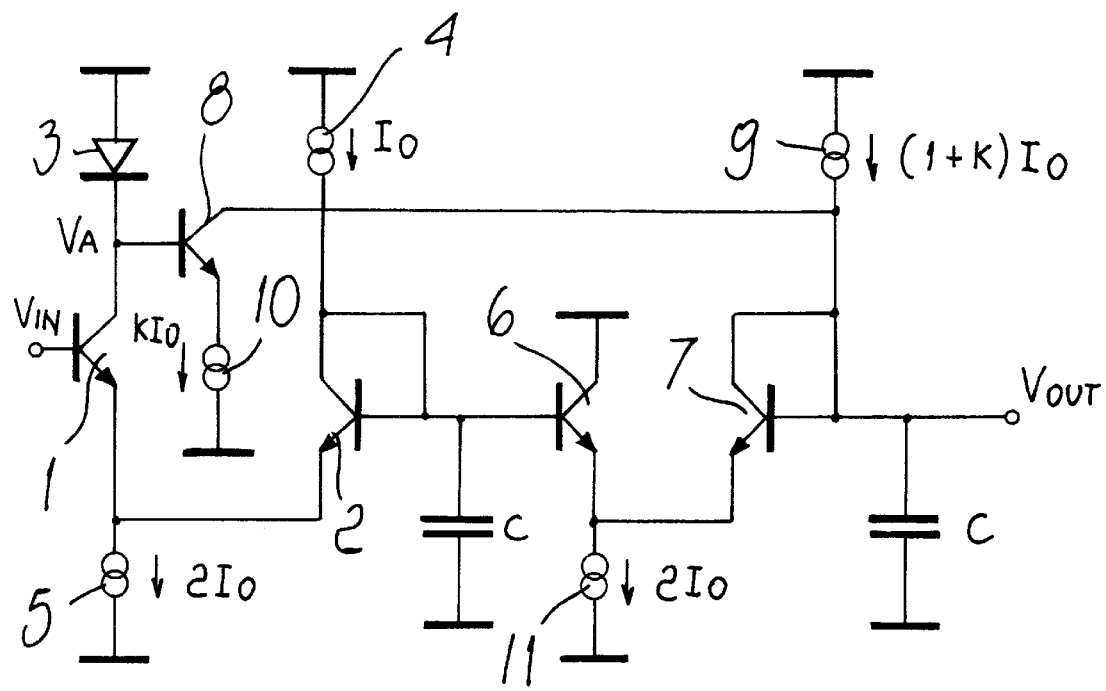
FIG. 1 is a circuit diagram of an embodiment of a first cell of the feedforward circuit structure according to the present invention.
Figure 2:
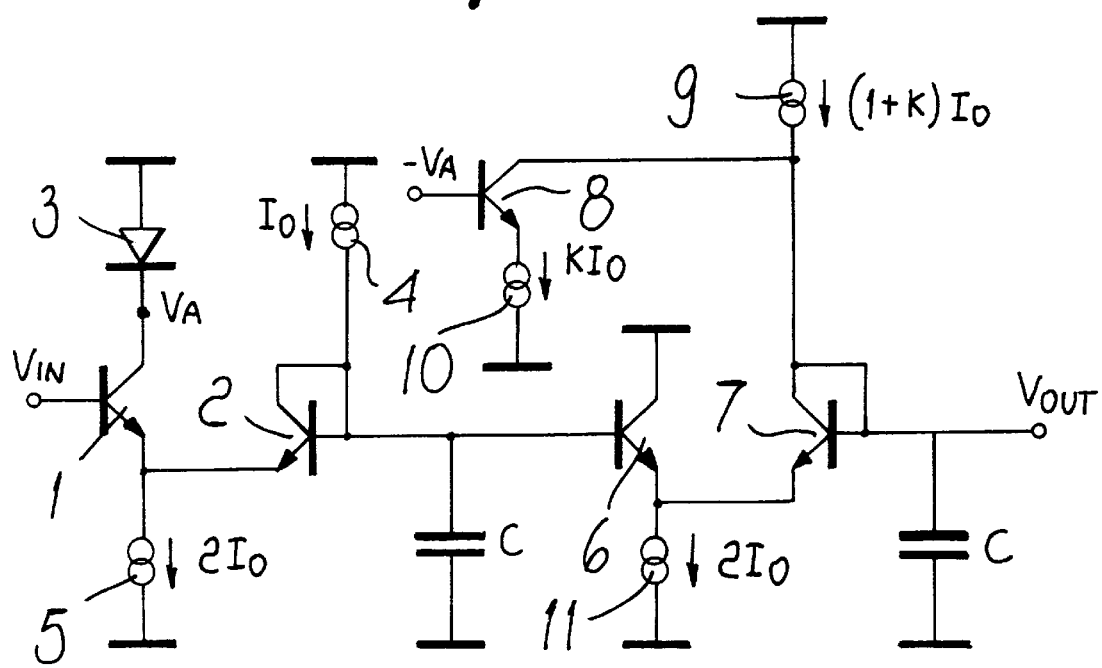
FIG. 2 is a circuit diagram of an embodiment of a second cell of the feedforward circuit structure according to the present invention.

With reference to the above figures, the feedforward structure according to the present invention is illustrated in FIG. 1 as regards the provision of a singularity (zero) in the left half-plane and in FIG. 2 as regards the provision of a singularity (zero) in the right half-plane.

The circuit of FIG. 1 comprises a first circuit section and a second circuit section which are mutually connected. The first circuit section comprises a first pair of bipolar transistors, which are referenced as first transistor 1 and second transistor 2. The first bipolar transistor 1 receives an input signal Vin at its base terminal. A diode 3 and a first current source 4 are respectively connected to the collector terminals of the pair of bipolar transistors 1 and 2. The first current source 4 supplies a current $I_0$. The emitter terminals of the transistors 1 and 2 are then connected to a second current source 5 that supplies a current $2I_0$. A first capacitor C is connected to the base terminal of the bipolar transistor 2.

The second circuit section comprises a second pair of bipolar transistors, which are referenced as third transistor 6 and fourth transistor 7. The third bipolar transistor 6 has its base terminal connected to the base terminal of the second transistor 2, and the collector terminal of transistor 6 is connected to the supply voltage.

The emitter terminals of the transistors 6 and 7 are biased by a third current source 11 whose value is equal to the second current source 5. The bipolar transistor 7 is diode-connected, and a second capacitor C, for example equal in value to the first capacitor, is connected to the base terminal of the transistor 7. A fourth current source 9, whose value is (1+K) times the value of the first current source 4, is connected to the common node between the base terminal and the collector terminal of the transistor 7.

Finally, a fifth bipolar transistor 8 is connected, by means of its base terminal, to the collector terminal of the transistor 1 and, by means of its collector terminal, to the common node between the base terminal and the collector terminal of the bipolar transistor 7, thus providing an additional connection between the first and second circuit sections. A fifth current source 10 is connected to the emitter terminal of the fifth bipolar transistor 8 and its value is K times the value of the first current source 4.

In FIG. 2, identical reference numerals designate identical elements. The difference between the circuit of FIG. 1 and the circuit of FIG. 2 resides in the fact that the fifth bipolar transistor 8 receives in input a signal which is taken from the collector terminal of the bipolar transistor 1, with its sign changed.

In this manner, the transfer function of the circuit of FIG. 1 is given by:

$$H1(s)=Vout/Vin=(1+sK/W_0)/(1+s/W_0)^2$$

while the transfer function of the circuit of FIG. 2 is given by:

$$H2(s)=Vout/Vin=(1-sK/W_0)/(1+s/W_0)^2$$

The global transfer function of the two above-described cells, which are cascade-connected and shown respectively in FIGS. 1 and 2, is thus given by the product of the two transfer functions H1(s) and H2(s). It is thus possible to obtain:

$$H(s)=[1-(Ks/W_0)^2]/(1+S/W_0)^4$$

This transfer function produces a pair of real zeros which are arranged respectively in the left half-plane and in the right half-plane if the value of K is chosen equal for the circuit of FIG. 1 and for the circuit of FIG. 2. If one chooses K=K1 and K=K2, with K1 different from K2, then the resulting transfer function has a term in "s" at the numerator and is of the $1+\beta s-\alpha s^2$ type.

The above-described circuit structure allows, by means of a simple cascade connection of the two cells, to obtain a transfer function with two real zeros. In this case, the group delay remains flat for the band of interest of the signal.

If the transfer functions of the two cells provided according to the present invention are instead obtained so that their respective numerators have mutually different terms in K, i.e., so that K=K1 for a first transfer function and K=K2 for a second transfer function, it is possible to obtain a global transfer function (determined by the product of the transfer functions of the two cascade-connected cells) wherein a polynomial of the $1+\beta s-\alpha s^2$ is present at the numerator. In this second case, by varying the terms K1 and K2 it is possible to have a preset variation of the group delay without varying the band of the signal.

As will be understood by those skilled in the art, the above-described feedforward circuit structure is susceptible of numerous modifications and variations, all of which are within the scope of the inventive concept. For example, the capacitors C of the two cells can be chosen so as to have mutually different values. Also, all the particularly described circuit elements used in the above-described circuit structure may be replaced with other technically equivalent circuit elements.

From the foregoing it will be appreciated that, although specific embodiments of the invention have been described herein for purposes of illustration, various modifications may be made without deviating from the spirit and scope of the invention. Accordingly, the invention is not limited by the particular disclosure above, but instead the scope of the invention is determined by the following claims.

What is claimed is:

1. A feedforward circuit structure with programmable zeros comprising a first cell and a second cell which are cascade-connected, each one of said first and second cells comprising:

a first pair of bipolar transistors in which emitter terminals are connected to a first current source, a second pair of bipolar transistors in which emitter terminals are connected to a second current source;

a first high-impedance element connected between said first and second pairs of transistors;

a second high-impedance element connected at an output of said second pair of transistors; and a fifth transistor being connected between a collector terminal of a first transistor of said first pair of transistors and a collector terminal of a second transistor of said second pair of transistors, a base terminal of said fifth transistor receiving a signal which is taken from the collector terminal of said first transistor of the first pair of transistors, said signal being taken with a positive sign in said first cell and with a negative sign in said second cell;

and wherein a second transistor of said first pair of transistors and the second transistor of said second pair of transistors are controlled respectively by third and fourth current sources which have mutually different values.

2. A feedforward structure according to claim 1 wherein the third and fourth current sources are connected to the collector terminals of said second transistors.

3. A feedforward structure according to claim 1 wherein said second transistors of said first and second pairs of transistors are diode-connected.

4. A feedforward structure according to claim 1 wherein said fifth transistor has a fifth current source connected to its emitter terminal.

5. A feedforward structure according to claim 4 wherein said fifth current source has a value equal to K times the value of the third current source.

6. A feedforward structure according to claim 1 wherein the third and fourth current sources are connected to the collector terminals of said second transistors, the value of the fourth current source being equal to (1+K) times the value of the third current source.

7. A cell with feedforward circuit structure having programmable zeros, comprising:

a first pair of bipolar transistors;

a second pair of bipolar transistors;

a first high-impedance element coupling the first and second pairs of transistors;

a second high-impedance element coupled at an output of said second pair of transistors; and a further transistor being connected between a first transistor of said first pair and a second transistor of said second pair, wherein said further transistor has a base terminal connected to a collector terminal of said first transistor of the first pair of transistors, and said further transistor has a collector terminal connected to a collector terminal of the second transistor of said second pair of transistors.

8. A cell with feedforward circuit structure according to claim 7 wherein a signal taken from the collector terminal of said first transistor of the first pair of transistors is input to the base terminal of said further transistor.

9. A cell with feedforward circuit structure according to claim 7 wherein a signal taken from the collector terminal of said first transistor of the first pair of transistors is input, with its sign changed, to the base terminal of said further transistor.

10. A cell with feedforward circuit structure according to claim 7, further comprising first and second current sources, the first current source connected to a collector terminal of a second transistor of the first pair of transistors, the second current source connected to the collector terminal of said second transistor of the second pair of transistors, the value of the second current source being equal to (1+K) times the value of the first current source.

11. A cell with feedforward circuit structure according to claim 10, further comprising a third current source having a value which is K times the value of the first current source, the third current source being connected to an emitter terminal of said further transistor.

12. A circuit having programmable zeros for providing a programmable group delay of a high bandwidth signal, comprising first and second cascade-connected cells, each of the cells comprising:

a first transistor pair having first and second transistors each having a current terminal coupled with a first current source, and a control terminal of the first transistor providing a cell input;

a second transistor pair having third and fourth transistors each having a current terminal coupled with a second current source, a control terminal of the third transistor being coupled with a control terminal of the second transistor, and a control terminal of the fourth transistor providing a cell output; and a fifth transistor having a control terminal coupled with another current terminal of the first transistor, and the fifth transistor having a current terminal coupled with the control terminal of the fourth transistor.

13. The circuit of claim 12 wherein the control terminal of the fifth transistor in the first cell is coupled to receive a voltage produced at the other current terminal of the first transistor, and wherein the control terminal of the fifth transistor in the second cell is coupled to receive a reversed polarity of the voltage produced at the other current terminal of the first transistor.

14. The circuit of claim 12 wherein each of the transistors is a bipolar transistor.

15. The circuit of claim 12 wherein the first and second current sources provide substantially the same current magnitudes.

16. The circuit of claim 12, further comprising first and second impedance elements, the first impedance element being coupled to the control terminals of the second and third transistors, and the second impedance element being coupled with the control terminal of the fourth transistor.

17. The circuit of claim 16 wherein the first and second impedance elements are substantially identical.

18. The circuit of claim 16 wherein the first and second impedance elements each include a capacitor.

19. The circuit of claim 12, further comprising third and fourth current sources, the third current source being coupled with another current terminal of the second transistor, and the fourth current source being coupled with another current terminal of the fourth transistor, the third and fourth current sources providing different current magnitudes.

20. The circuit of claim 19 wherein the first and second current sources provide substantially the same current magnitudes which are each approximately twice the current magnitude of the third current source.

21. The circuit of claim 19 wherein the current magnitude of the fourth current source differs from the current magnitude of the third current source by a factor (1+K), and wherein the circuit further comprises a fifth current source coupled with another current terminal of the fifth transistor, the current magnitude provided by the fifth current source differing from the current magnitude of the third current source by a factor K.

22. the circuit of claim 19 wherein the second transistor is diode-connected with its other current terminal connected to its control terminal, and wherein the fourth transistor is diode-connected with its other current terminal connected to its control terminal.

* * * * *